United States Patent
Chai et al.

(10) Patent No.: US 7,586,772 B2
(45) Date of Patent: Sep. 8, 2009

(54) METHOD AND APPARATUS FOR ABORTING CONTENT ADDRESSABLE MEMORY SEARCH OPERATIONS

(75) Inventors: Chiaming Chai, Chapel Hill, NC (US); Jeffrey Herbert Fischer, Cary, NC (US); Michael ThaiThanh Phan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 286 days.

(21) Appl. No.: 11/462,457

(22) Filed: Aug. 4, 2006

(65) Prior Publication Data

US 2008/0031040 A1    Feb. 7, 2008

(51) Int. Cl.
    *G11C 15/00* (2006.01)
(52) U.S. Cl. .................. 365/49.17; 365/189.07
(58) Field of Classification Search ............... 365/49.1, 365/49.11, 49.12, 49.13, 49.15, 49.16, 49.17, 365/189.07
See application file for complete search history.

(56) References Cited

U.S. PATENT DOCUMENTS

| | | | |
|---|---|---|---|
| 6,191,970 B1 * | 2/2001 | Pereira | 365/49.1 |
| 6,243,280 B1 * | 6/2001 | Wong et al. | 365/49.17 |
| 6,768,659 B2 * | 7/2004 | Gillingham et al. | 365/49.16 |
| 7,113,415 B1 * | 9/2006 | Khanna | 365/49.16 |
| 2004/0145934 A1 * | 7/2004 | Arsovski et al. | 365/49 |

OTHER PUBLICATIONS

K. Pagiamtzis and A. Sheikholeslami, "A Low-Powr Content-Addressable Memory (CAM) Using Pipelined Hierarchical Search Scheme," IEEE Journal of Solid-State Circuits, vol. 39, No. 9 Sep. 2004, pp. 1512-1519.*

* cited by examiner

*Primary Examiner*—Richard Elms
*Assistant Examiner*—Harry W Byrne
(74) *Attorney, Agent, or Firm*—Nicholas J. Pauley; Peter M. Kamarchik; Sam Talpalatsky

(57) ABSTRACT

Content Addressable Memory (CAM) search operations are aborted in response to a search abort signal, thus preserving previous CAM search results. In one embodiment, a CAM search operation is aborted by activating a local CAM match line in response to a search field provided to a CAM and preventing activation of a global CAM match line associated with the local CAM match line in response to a search abort signal. By preventing activation of global CAM match lines, monotonic storage devices included in a holding register that captures CAM search results are prevented from overwriting previously stored CAM search results.

6 Claims, 6 Drawing Sheets

METHOD AND APPARATUS FOR ABORTING CONTENT ADDRESSABLE MEMORY SEARCH OPERATIONS

BACKGROUND

1. Field of the Invention

The present invention generally relates to Content Addressable Memories (CAMs), and particularly relates to aborting CAM search operations.

2. Relevant Background

Content Addressable Memories (CAMs) are used to implement search-intensive tasks such as packet forwarding and classification in network routers, cache lookups and address translations in microprocessors, data coding/decoding, image coding, data compression/decompression, database acceleration, neural networking, etc. Conventional CAMs have a table of stored data arranged in groups, e.g., rows of data words. Each group comprises a plurality of CAM cells for storing data. CAM cells may be binary (store binary data) or ternary (store binary data or a 'don't care' state). During a CAM search operation, each match line is pre-charged to a logic high value, i.e., a voltage level that represents a logic one. A search field is then input to the CAM and broadcast onto search lines to the table of stored data. A match line coupled to each group of CAM cells indicates whether the search field matches data stored by a particular group. For example, in the event of a mismatch, also referred to as a miss, the match lines associated with the group or groups that cause a mismatch are activated by being discharged. Conversely, the match lines associated with the group or groups that yield a match, also referred to as a hit, remain pre-charged. CAMs that use ternary cells may produce multiple matched results since the 'don't care' state may yield multiple matches.

Some conventional CAMs incorporate multiple levels of match lines to reduce the adverse effects associated with capacitive loading. In such multi-level CAMs, each grouping of CAM cells includes multiple local match lines where each local match line detects hit/miss results for a subset of the CAM cells forming a particular group. The local match lines serving a certain group of CAM cells are coupled to a global match line. A mismatch indicated by one or more local match lines is reflected by the corresponding global match line. As such, a global match line yields a miss if any one of its corresponding local match lines indicates a miss. Conversely, the global match line yields a hit if all of its corresponding local match lines indicate a hit. Depending on CAM size, one or more intermediary match line levels may be included between local match lines and a corresponding global match line to further reduce the adverse effects of capacitive loading.

In one application, CAMs are used to implement high-performance processor caches. A conventional processor cache comprises a CAM portion and a RAM portion. The CAM portion stores data used for address lookups. The RAM portion stores data associated with the address data stored in the CAM. During a lookup portion of a processor cache access, the CAM is searched to determine whether an address of interest is stored in the CAM. If the CAM lookup yields a hit, the matching address is supplied to the RAM during a read portion of the cache access. The RAM provides data corresponding to the matched address during the read portion of the processor cache access.

Conventional processor cache access operations require multiple cycles, e.g., to identify matching addresses stored in a CAM and to read the corresponding data from a RAM. To prevent CAM search results from being lost during a multi-cycle cache access, a holding register stores CAM lookup results for subsequent use by a RAM. Conventional holding registers are formed from either static or monotonic storage devices. Static storage devices, e.g., static Complimentary Metal Oxide Semiconductor (CMOS) latches, have an output node that switches either high or low in response to a clock signal input. Conversely, monotonic storage devices, e.g., zero-catcher, one-catcher or jam latches, have an output skewed to favor a certain direction (high or low). Static storage devices capture input data, e.g., the state of a global CAM match line, in response to a clock signal input. However, the hit/miss state of a global match line is not determined until the end of the CAM access cycle, thus leaving little timing margin for the static CMOS storage device to capture the hit/miss state in response to a clock signal input.

Monotonic storage devices are skewed to favor one logic switching direction or another, but not both. For example, a zero-catcher latch captures a logic zero value without having to receive an active clock signal while a one-catcher latch captures a logic high value. Conversely, a zero-catcher latch captures a logic one value in response to an active clock signal while a one-catcher captures a logic zero value. As such, monotonic storage devices rapidly capture either a logic low state (zero-catcher) or logic high state (one-catcher) during a CAM evaluation period. For example, a zero-catcher latch captures a logic zero without regard to a clock signal input, thus near-instantaneously reacting to match line miss results. Likewise, a one-catcher latch captures a logic one near-instantaneously. Unlike static storage devices, monotonic storage devices almost immediately reflect the hit/miss state of a global match line regardless of a clock signal input, thus causing CAM search results previously stored in a corresponding holding register to be overwritten.

SUMMARY OF THE DISCLOSURE

According to the methods and apparatus taught herein, a Content Addressable Memory (CAM) search operation is aborted in response to a search abort signal, thus preserving previous CAM search results. In one embodiment, a CAM search operation is aborted by activating a local CAM match line in response to a search field provided to a CAM and preventing activation of a global CAM match line associated with the local CAM match line in response to a search abort signal. By preventing activation of global CAM match lines, monotonic storage devices included in a holding register that captures CAM search results are prevented from overwriting previously stored CAM search results.

According to one embodiment of a multi-level CAM, the multi-level CAM comprises groups of one or more CAM cells, a plurality of local CAM lines coupled to each group of CAM cells and a global match line associated with each group of CAM cells. The groups of one or more CAM cells are configured to store data and at least one of the local CAM match lines is configured to activate in response to a search field provided to the multi-level CAM. In response to at least one of the local CAM match lines activating, at least one of the global CAM match lines is configured to activate. The multi-level CAM also includes circuitry, e.g., logic AND gate circuitry, configured to prevent activation of the global CAM match lines in response to a search abort signal. The multi-level CAM may be included in a memory device such as a microprocessor cache.

According to one embodiment of a memory device, the memory device comprises a multi-level CAM and a Random Access Memory (RAM). The multi-level CAM includes a plurality of global match lines and search abort circuitry. At least one of the global match lines is configured to activate in response to a search field provided to the multi-level CAM. The search abort circuitry is configured to prevent the global match lines from activating in response to a search abort signal. The RAM is configured to provide data corresponding to at least one activated global match line.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
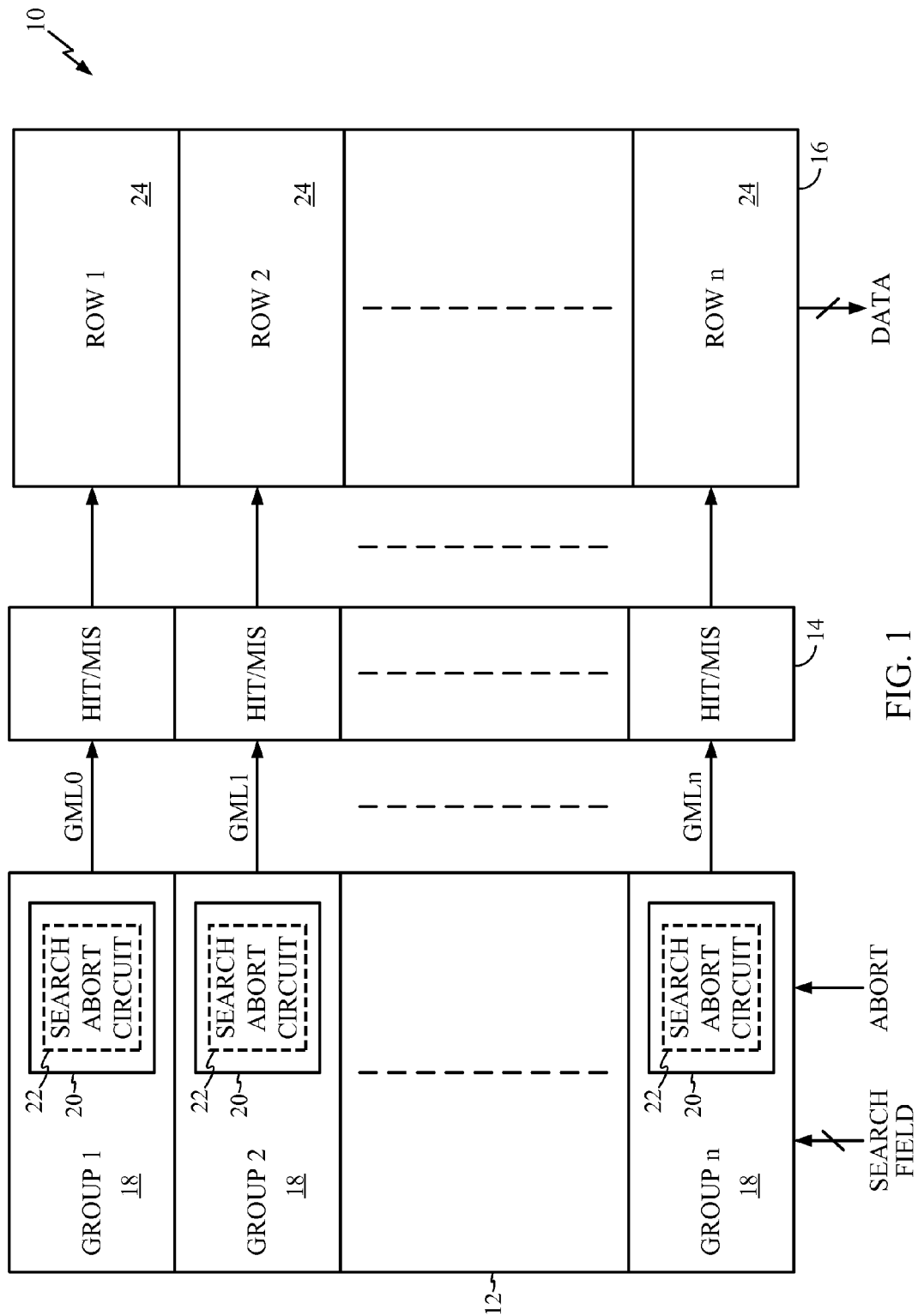
FIG. 1 is a block diagram illustrating an embodiment of a memory device including a multi-level Content Addressable Memory (CAM) having search abort circuitry.

FIG. 1 illustrates an embodiment of a memory device 10 such as a cache including a multi-level Content Addressable Memory (CAM) 12, a holding register 14 and a Random Access Memory (RAM) 16 such as a Dynamic RAM (DRAM), Static RAM (SRAM) or embedded-DRAM (e-DRAM). The multi-level CAM 12 has multiple memory cells (not shown) such as binary or ternary CAM cells for storing data. The CAM cells are arranged in groups 18, e.g., rows, where each group 18 is coupled to a Global Match Line (GML0-GMLn). Each GML indicates whether its corresponding group 18 of CAM cells contains a data sequence that matches a search field provided to the CAM 12. That is, the GMLs indicate whether a data sequence stored by the CAM 12 matches a search field input (hit) or mismatches (miss). In one embodiment, each GML coupled to a group 18 of CAM cells containing a matching data sequence is activated. In another embodiment, each GML coupled to a group 18 of CAM cells containing a non-matching data sequence is activated. In the present context, 'activate' corresponds to setting the state of the GMLs to indicate CAM search results, e.g., by discharging pre-charged GMLs or charging pre-discharged GMLs. Regardless, precharge and evaluation circuitry 20 coupled to each group of CAM cells 18 has search abort circuitry 22 included in or associated therewith for preventing activation of the GMLs in response to a search abort signal (ABORT). As such, a CAM search operation may be aborted before the GMLs are activated, thus enabling the holding register 14 to retain prior CAM search results.

In more detail, the multi-level CAM 12 is provided a search field such as an address during a search portion of a memory access. The CAM 12 searches each group 18 of memory cells for a stored data sequence that matches the search field. Each GML associated with a group 18 of CAM cells that contains a matching data sequence is activated by the precharge and evaluation circuitry 20 in one embodiment while each GML associated with a group 18 of CAM cells that contains a non-matching data sequence is activated in another embodiment. The state of each GML is captured by the holding register 14 (hit/miss). The holding register 14 comprises high-performance monotonic storage devices (not shown) such as zero-catcher latches, one-catcher latches, or jam latches. As such, the holding register 14 is capable of capturing the activation state of GMLs without regard to a clock signal input. That is, the monotonic storage devices sense GML activation regardless of clock signal transitions, thus enabling the holding register 14 to capture GML activation states near instantaneously. During a read portion of the memory access, each entry 24 in the RAM 16 associated with a 'hit' result stored in the holding register 14 is accessed and the corresponding data read.

In response to a search abort signal, the search abort circuitry 22 prevents the GMLs from activating during a CAM search operation. Aborting a CAM search operation before the GMLs are activated prevents the contents of the holding register 14 from being altered by the monotonic storage devices that form the storage elements of the holding register 14. As such, monotonic storage devices may be incorporated in the holding register 14 to improve performance while the search abort circuitry 22 preserves hit/miss search results presently stored in the holding register 14 in response to a search abort signal. Absent the search abort circuitry 22, the holding register 14 overwrites prior hit/miss search results each time a GML is activated.

Figure 2:
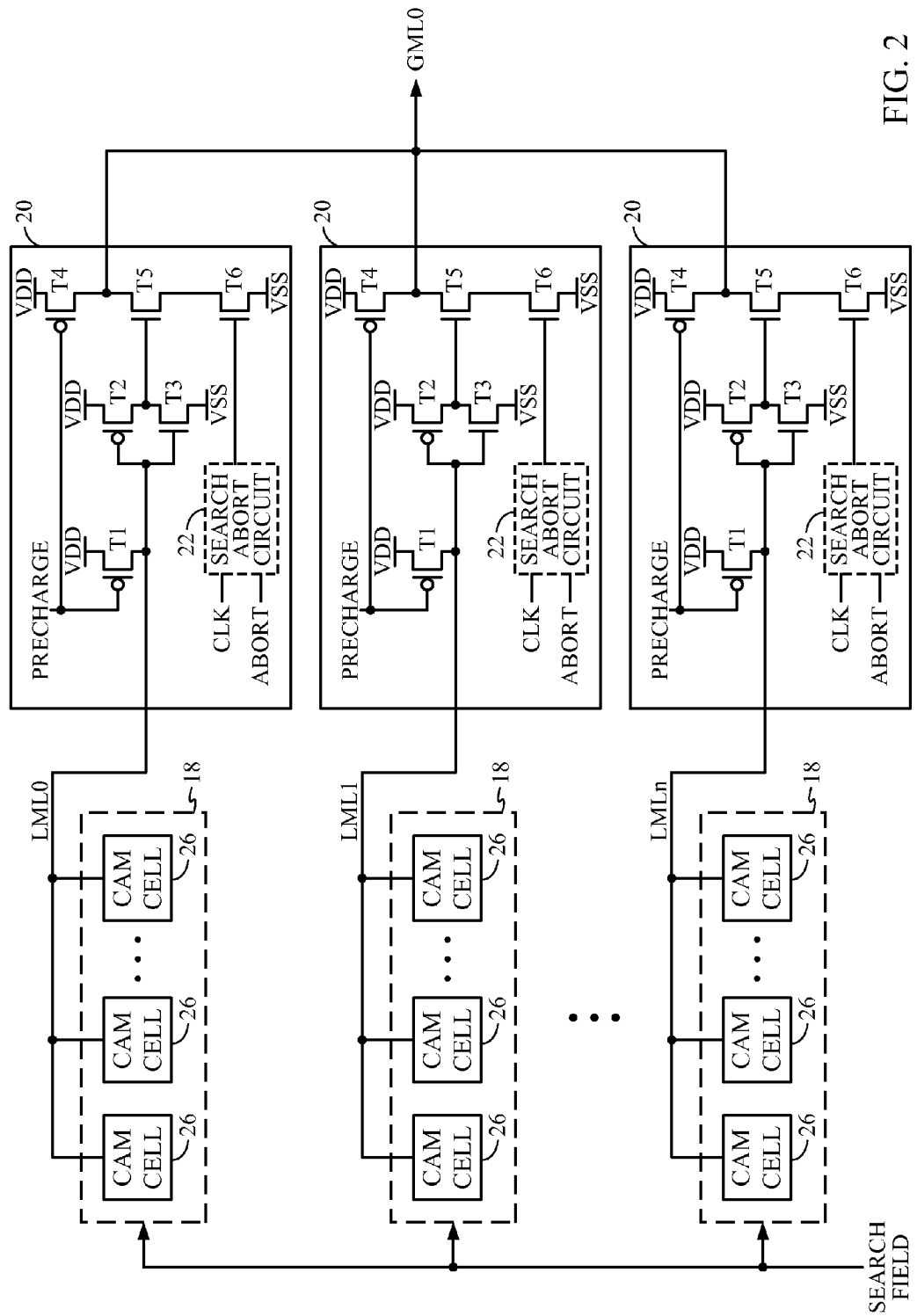
FIG. 2 is a block diagram partially illustrating an embodiment of a multi-level CAM.

FIG. 2 is a partial illustration of one embodiment of the multi-level CAM 12. Individual CAM cells 26 are arranged into N groups 18, e.g., rows, where each group 18 is coupled to a Local Match Line (LML). The LMLs indicate whether their corresponding group 18 of CAM cells yields a match (hit) or mismatch (miss) in response to a search field or a portion of a search field provided to the CAM 12. Each LML is coupled to an instantiation of the precharge and evaluation circuitry 20. The output of each instantiation of the precharge and evaluation circuitry 20 are coupled together to form one of the GMLs (GML0) of the CAM 12. Although not illustrated, numerous other GMLs may be formed in a like manner. For example, a 64-entry CAM may have 64 GMLs (one for each CAM entry). The search abort circuitry 22 associated with each LML prevents GML0 from activating in response to a search abort signal (ABORT), thus preserving the current state of GML0 as stored in the holding register 14.

Figure 3:
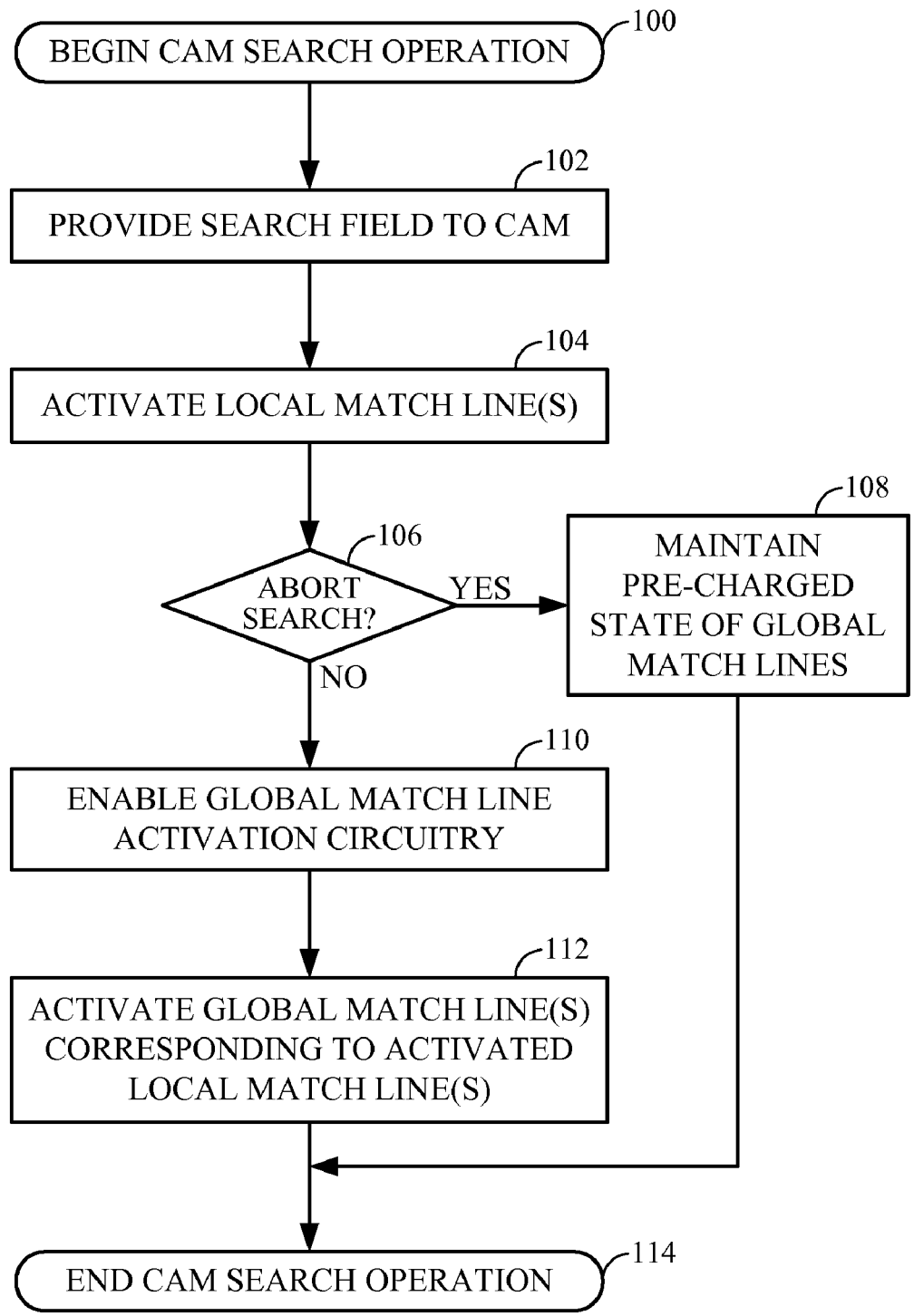
FIG. 3 is a logic flow diagram illustrating an embodiment of program logic for aborting a CAM search operation.

In one embodiment, the precharge and evaluation circuitry 20 includes a LML precharge circuit (p-FET T1), an inverter (p-FET T2 and n-FET T3), a GML precharge circuit (p-FET T4), and a GML discharge circuit (n-FETs T5 and T6). For ease of explanation only, reference is made hereinafter to pre-charging of match lines and activating the pre-charged match lines by discharging them. However, those skilled in the art will readily recognize that a match line may be pre-discharged and subsequently activated by being charged. With this understanding, a CAM search operation begins with the LML pre-charge circuit pre-charging each LML associated with GML0 to $V_{dd}$, as illustrated by Step 100 of FIG. 3. In addition, the GML pre-charge circuit pre-charges GML0. The LMLs and GML0 may be pre-charged in response to the same precharge signal (PRECHARGE) as illustrated in FIG. 2, or alternatively, may be pre-charged in response to separate signals. Once pre-charged, each LML is ready for activation by its corresponding group 18 of CAM cells. A search field is provided to the CAM 12, as illustrated by Step 102 of FIG. 3. Each group 18 of CAM cells storing a data sequence not matching the search field activates its corresponding LML by discharging it, as illustrated by Step 104 of FIG. 3. Otherwise, the LMLs remain in their pre-charged state in response to a search hit.

Regardless of the underlying organization of the multi-level CAM 12, each LML coupled to an instantiation of the precharge and evaluation circuitry 20 remains in its pre-charged high state unless one of the LMLs is activated in response to a search mismatch. If one or more of the LMLs is activated and thus discharged, the input to the inverter of the precharge and evaluation circuitry 20 is driven to a logic-low level. Otherwise, the inverter input remains at the pre-charged state. The search abort circuitry 22 determines whether the present CAM search operation should be aborted in response to a search abort signal, as illustrated by Step 106 of FIG. 3. In one embodiment, the search abort circuitry 22 comprises logic AND gate circuitry 27 that uses the abort signal, e.g., an activated late select signal, to gate a clock signal input (CLK) to the GML discharge circuit. Those skilled in the art will readily recognize that the search abort circuitry 22 may comprise other circuitry for gating the clock signal input to the GML discharge circuit such as logic NAND gate circuitry (not shown).

Regardless, if the abort signal is active, e.g., at a logic high value, the search abort circuitry 22 blocks the clock signal from enabling the GML discharge circuit, thus preventing GML0 from being activated in the event of a CAM search mismatch. That is, when the second transistor T6 of the GML discharge circuit is disabled by the search abort circuitry 22, GML0 cannot be discharged to $V_{ss}$ since its discharge path is blocked. As a result GML0 remains in its pre-charged state, as illustrated by Step 108 of FIG. 3. Conversely, if the abort signal is not active, the search abort circuitry 22 passes the clock signal to the GML discharge circuit, thus enabling it, as illustrated by Step 110 of FIG. 3. When enabled, the GML discharge circuit activates GML0 in the event of a CAM search mismatch by discharging GML0 to $V_{ss}$, as illustrated by Step 112 of FIG. 3. The CAM search operation then ends, as illustrated by Step 114 of FIG. 3. The program logic illustrated in FIG. 3 enables the multi-level CAM 12 to activate LMLs in response to a search field input without activating a corresponding GML unless the discharge circuit associated with the GML is enabled. Until then, the GML remains in its pre-charged state, unaffected by the search results produced by the corresponding LMLs. In turn, the monotonic storage devices included in the holding register 14 do not alter previously stored data.

Figure 4:
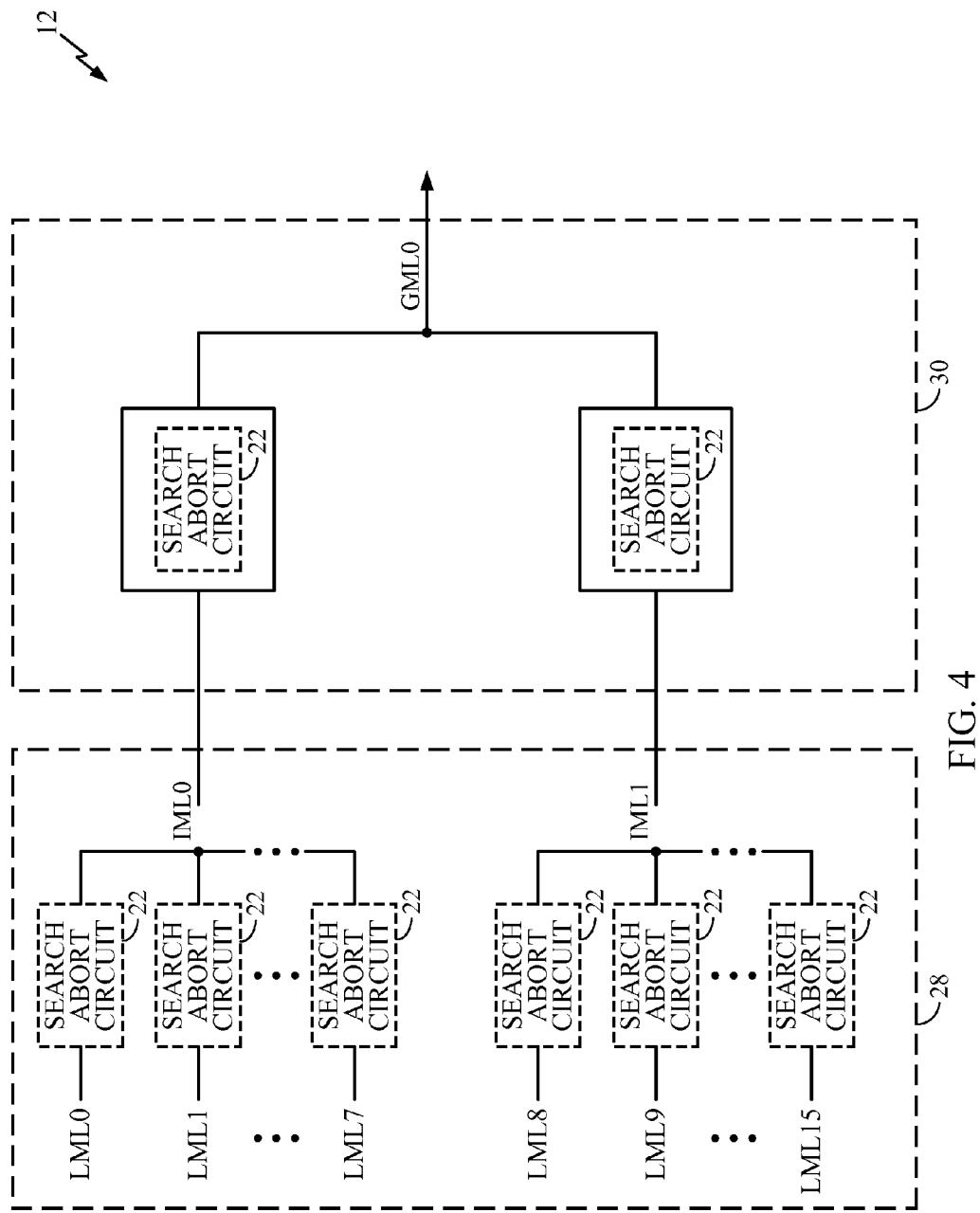
FIG. 4 is a block diagram partially illustrating another embodiment of a multi-level CAM.

FIG. 4 is a partial illustration of one embodiment of the multi-level CAM 12 wherein the CAM 12 has two hierarchical match line levels 28-30 coupled to a GML (GML0). Although not illustrated, numerous other GMLs may be formed in a like manner. With this in mind, the first hierarchical level 28 receives various LML inputs (LML0-LML15), the LMLs being coupled to respective groups of CAM cells (not shown). The search abort circuitry 22 controls whether corresponding intermediary match lines (IML0-IML1) are activated or not in response to the activation state of the LMLs, a clock signal input (CLK) and a search abort signal (ABORT) as previously described. The intermediary match lines are then input to a second hierarchal level 30, where they are gated by the search abort circuitry 22. The search abort circuitry 22 included in or associated with the second hierarchal level 30 controls whether GML0 is activated or not in response to the activation state of IML0 and IML1. Thus, activation of GML0 may be prevented by blocking activation of the intermediary level 28 of match lines or the global match line level 30. Regardless of the number of intermediary match line levels, the monotonic storage devices included in the holding register 14 do not alter previously stored data if the search abort circuitry 22 prevents the GMLs of the multi-level CAM 12 from activating.

Figure 5:
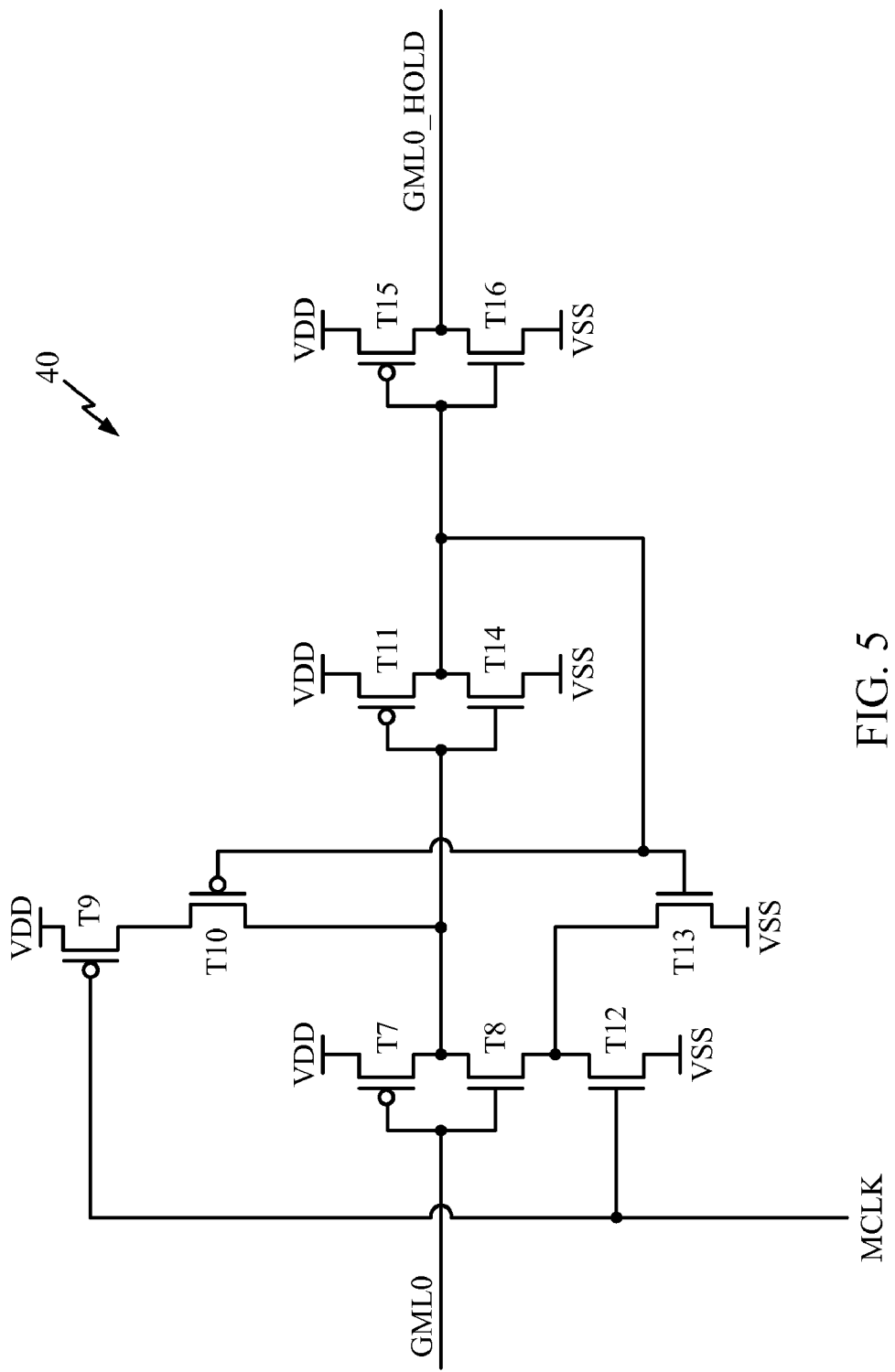
FIG. 5 is a circuit diagram illustrating an embodiment of a zero-catcher monotonic storage device.

FIG. 5 illustrates an embodiment of a zero-catcher latch 40 included in the holding register 14 for capturing GML activation states (hit/miss results). The zero-catcher latch 40 captures a logic one input during an active portion of a clock signal input (MCLK) and captures a logic zero without regard to the clock signal. The zero-catcher latch 40 comprises an input inverter (p-FET T7 and n-FET T8), latch circuitry (p-FETs T9-T11 and n-FETs T12-T14) and an output inverter (p-FET T15 and n-FET T16). When MCLK is inactive, the latch circuitry stores the data value currently captured by the zero-catcher latch. Transistor T12 coupled between $V_{ss}$ and the input inverter prevents the input inverter from inverting a logic one unless MCLK is active. However, the inverter inverts a logic zero regardless of the state of MCLK, hence the name 'zero-catcher'. However, the search abort circuitry 22 prevents activation of the GML input (GML0) to a logic zero state when the search abort signal is active, thus preventing the zero-catcher latch 40 from capturing a logic zero GML state. The output inverter inverts the data stored by the latch circuitry, thus yielding the opposite signal level (GML0_HOLD) as the data originally provided to the zero-catcher input inverter (GML0). Those skilled in the art will readily recognize that one-catcher latches (not shown) could be used in place of zero-catcher latches if the multi-level CAM 12 yields activated GMLs by charging pre-discharged GMLs instead of discharging pre-charged GMLs. A one-catcher latch functions much the same way as the zero-catcher latch 40 except that a one-catcher latch captures logic one input signals notwithstanding the state of a clock signal input instead of logic zero input signals. Regardless of the particular monotonic storage device used, data stored in the holding register 14 will not be overwritten by the multi-level CAM 12 when the abort signal is activated during a CAM search operation, thus preserving data previously stored by the holding register 14.

Figure 6:
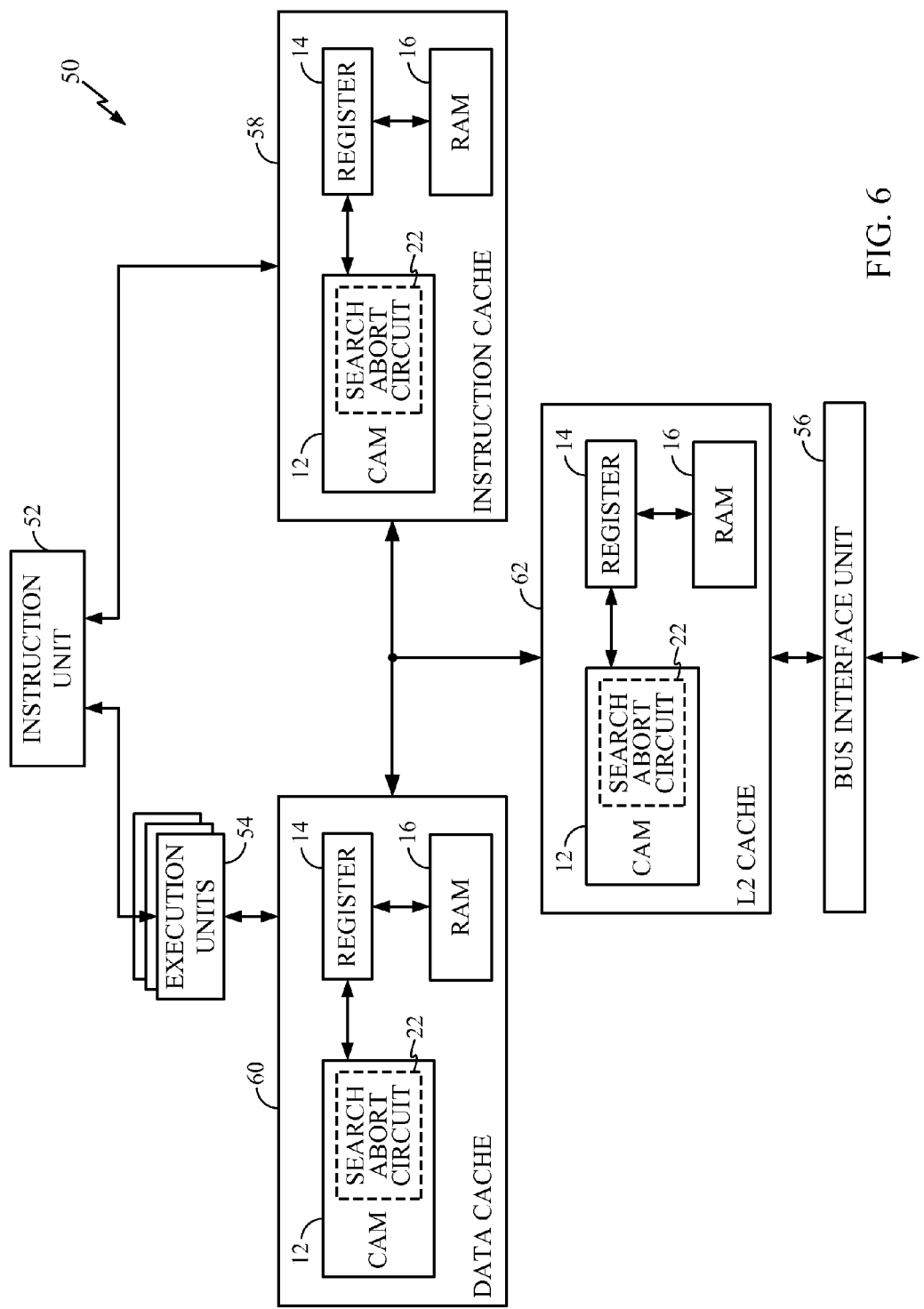
FIG. 6 is a block diagram illustrating an embodiment of a microprocessor including a multi-level CAM.

FIG. 6 illustrates an embodiment of a processor 50 that includes an instruction unit 52, one or more execution units 54 and a bus interface unit 56. The instruction unit 52 provides centralized control of instruction flow to the execution units 54. The execution units 54 execute instructions dispatched by the instruction unit 52 and the bus interface unit 56 provides a mechanism for transferring data, instructions, addresses, and control signals to and from the processor 50. The processor 50 also includes an instruction cache 58, a data cache 60 and a higher-level cache (L2 cache) 62. The instruction and data caches 58, 60 store instructions and data, respectively. The L2 cache 62 provides a high-speed memory buffer between the data and instruction caches 58, 60 and memory (not shown) external to the processor 50.

The caches 58, 60 and 62 included in the processor 50 have a CAM portion 12, a RAM portion 16 and a holding register 14. Each CAM 12 returns a list of one or more matching addresses corresponding to a search field supplied to it. A matching memory address, represented as a hit/miss entry or an encoded memory address stored in the respective holding registers 14, is provided to a corresponding RAM 16. Each RAM 16 returns data stored at the memory address supplied to it. In the event of a cache miss, a higher-level memory transaction occurs to retrieve the desired data.

Search abort circuitry 22 included in or associated with the CAMs 12 prevents activated LML results from propagating to corresponding GMLs. As such, data previously stored in the holding registers 14 is preserved in response to a search abort signal as previously described. The search abort signal may be generated by the processor 50, received by the processor 50 as part of an instruction stream, or received by the processor 50 as an external signal input. Regardless, monotonic storage devices (not shown) included in the holding registers 14 improve processor performance while the search abort circuitry 22, in response to a search abort signal, prevents the monotonic storage devices from overwriting hit/miss search results presently stored by the corresponding holding registers 14.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of aborting a content addressable memory (CAM) search operation, comprising:
   activating a local CAM match line in response to a search field provided to a CAM; and
   preventing activation of a global CAM match line associated with the local CAM match line in response to a search abort signal.

2. The method of claim 1, wherein preventing activation of a global CAM match line associated with the local CAM match line in response to a search abort signal comprises preventing discharging of the global CAM match line from a pre-charged state.

3. The method of claim 1, wherein preventing activation of a global CAM match line associated with the local CAM match line in response to a search abort signal comprises preventing charging of the global CAM match line from a pre-discharged state.

4. The method of claim 1, wherein preventing activation of a global CAM match line associated with the local CAM match line in response to a search abort signal comprises gating a clock signal operative to enable activation of the global CAM match line with the search abort signal.

5. The method of claim 1, wherein preventing activation of a global CAM match line associated with the local CAM match line in response to a search abort signal comprises preventing activation of an intermediary CAM match line associated with the local and global CAM match lines.

6. The method of claim 1, wherein the search abort signal corresponds to an activated late select signal.

* * * * *

UNITED STATES PATENT AND TRADEMARK OFFICE
CERTIFICATE OF CORRECTION

PATENT NO.        : 7,586,772 B2                                         Page 1 of 1
APPLICATION NO.   : 11/462457
DATED             : September 8, 2009
INVENTOR(S)       : Chai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 321 days.

Signed and Sealed this

Twenty-first Day of September, 2010

David J. Kappos
*Director of the United States Patent and Trademark Office*